(12) United States Patent
Lee et al.

(10) Patent No.: US 9,489,147 B2
(45) Date of Patent: Nov. 8, 2016

(54) SEMICONDUCTOR DEVICE, MEMORY DEVICE, AND SYSTEM INCLUDING THE SAME

(71) Applicant: SK hynix Inc., Gyeonggi-do (KR)

(72) Inventors: Kang-Seol Lee, Gyeonggi-do (KR); Woo-Sik Jeong, Gyeonggi-do (KR); Chun-Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 137 days.

(21) Appl. No.: 14/107,773

(22) Filed: Dec. 16, 2013

(65) Prior Publication Data

US 2015/0100850 A1    Apr. 9, 2015

(30) Foreign Application Priority Data

Oct. 7, 2013    (KR) .................. 10-2013-0119042

(51) Int. Cl.
| | | |
|---|---|---|
| *G11C 29/00* | (2006.01) | |
| *G06F 3/06* | (2006.01) | |
| *G06F 13/00* | (2006.01) | |
| *G06F 11/00* | (2006.01) | |
| *G11C 29/44* | (2006.01) | |
| *G11C 7/20* | (2006.01) | |
| *G11C 17/16* | (2006.01) | |

(52) U.S. Cl.
CPC ........... *G06F 3/0659* (2013.01); *G06F 3/0619* (2013.01); *G06F 3/0679* (2013.01); *G06F 11/00* (2013.01); *G06F 13/00* (2013.01); *G11C 29/44* (2013.01); *G11C 29/787* (2013.01); *G11C 29/802* (2013.01); *G11C 7/20* (2013.01); *G11C 17/16* (2013.01); *G11C 2029/4402* (2013.01)

(58) Field of Classification Search
CPC .. G06F 3/0619; G06F 3/0659; G06F 3/0679; G06F 11/00; G06F 13/00; G11C 2029/0405; G11C 2029/3062; G11C 29/54
USPC ........................................................ 714/718
See application file for complete search history.

(56) References Cited

U.S. PATENT DOCUMENTS

| | | | | |
|---|---|---|---|---|
| 5,522,076 A | * | 5/1996 | Dewa ..................... | G06F 9/4406 713/2 |
| 6,510,443 B1 | * | 1/2003 | Charlton ................ | G11C 29/02 365/201 |
| 6,667,902 B2 | | 12/2003 | Peng | |

(Continued)

FOREIGN PATENT DOCUMENTS

KR    1020090005813    1/2009

*Primary Examiner* — David Ton
(74) *Attorney, Agent, or Firm* — IP & T Group LLP (57) ABSTRACT

A memory device includes a memory array suitable for storing write data of the memory device and providing the stored data as read data of the memory device, a programmable storage unit suitable for storing information for the memory device, a command decoder suitable for storing decoding one or more command signals, and generating a write command for writing the write data, a read command for outputting the read data, and an information read command for outputting information stored in the programmable storage unit, a control unit suitable for controlling the information stored in the programmable storage unit to be sequentially read in response to activation of the information read command, and an output unit suitable for outputting the read information to an outside of the memory device in response to the information read command.

14 Claims, 5 Drawing Sheets

(56) References Cited

U.S. PATENT DOCUMENTS

| | | |
|---|---|---|
| 6,777,757 B2 | 8/2004 | Peng et al. |
| 6,940,751 B2 | 9/2005 | Peng et al. |
| 7,173,851 B1 | 2/2007 | Callahan et al. |
| 7,269,047 B1 | 9/2007 | Fong et al. |
| 2002/0015328 A1* | 2/2002 | Dono et al. ............... 365/185.08 |
| 2009/0063916 A1* | 3/2009 | Vogelsang .................... 714/719 |
| 2012/0120733 A1 | 5/2012 | Son et al. |
| 2013/0132670 A1* | 5/2013 | Nishikawa et al. .......... 711/114 |
| 2013/0182516 A1* | 7/2013 | Kinoshita ..................... 365/194 |
| 2015/0006995 A1* | 1/2015 | Yoon et al. ................... 714/766 |
| 2015/0055420 A1* | 2/2015 | Bell et al. ................ 365/189.02 |

* cited by examiner

FIG. 5

SEMICONDUCTOR DEVICE, MEMORY DEVICE, AND SYSTEM INCLUDING THE SAME

CROSS-REFERENCE TO RELATED APPLICATIONS

The present application claims priority of Korean Patent Application No. 10-2013-0119042, filed on Oct. 7, 2013, which is incorporated herein by reference in its entirety.

BACKGROUND

1. Field

Exemplary embodiments of the present invention relate to a semiconductor device, a memory device, and a system including the same.

2. Description of the Related Art

In a fabrication process of a semiconductor device, several times of tests are performed on the semiconductor device, and repair and setting operations for the semiconductor device are also performed according to the test result. For example, in a wafer level of a fabrication process of a memory device, repair of failed cells and setting of the various values are performed according to a test result for the memory device, and in a package level, repair of failed cells and setting of the various values are performed again according to another test result.

In the fabrication process of the memory device, since repair and setting operations are performed several times, it may be necessary to perform history management for repair and setting operations performed on respective memory devices in a previous step. For example, when 10,000 memory devices are fabricated at a time, only when history management is performed for repair and setting performed on the first to $10,000^{th}$ memory devices in a first test process, it may be possible to perform correct repair and setting on the first to $10,000^{th}$ memory devices in a second test process. Similarly, only when history management is performed for repair and setting performed on the first to $10,000^{th}$ memory devices up to the second test process, it may be possible to perform correct repair and setting on the first to $10,000^{th}$ memory devices in a third test process.

However, since it may be difficult to manage a history for each of many memory devices during a fabrication process, a countermeasure for such concern is in demand.

SUMMARY

Various embodiments of the present invention are directed to a technology for easily managing a repair history and/or a setting history in a semiconductor device, a memory device, and a system including the same.

In accordance with an embodiment of the present invention, a memory device may include a memory array suitable for storing write data of the memory device and providing the stored data as read data of the memory device, a programmable storage unit suitable for storing information for the memory device, a command decoder suitable for decoding one or more command signals, and generating a write command for writing the write data, a read command for outputting the read data, and an information read command for outputting information stored in the programmable storage unit, a control unit suitable for controlling the information stored in the programmable storage unit to be sequentially read in response to the information read command, and an output unit suitable for outputting the read information to an outside of the memory device in response to the information read command.

In accordance with another embodiment of the present invention, a semiconductor device may include a programmable storage unit suitable for storing boot-up information, one or more register units suitable for receiving and storing the boot-up information in a boot-up operation, and an output unit suitable for outputting the boot-up information to an outside when an information read command is applied.

In accordance with another embodiment of the present invention, a system may include a control device and a memory device. The memory device may include a memory array suitable for storing write data applied from the control device together with a write command, and providing the stored data as read data in response to a read command applied from the control device, a programmable storage unit suitable for storing information for the memory device, a control unit suitable for controlling the information stored in the programmable storage unit to be sequentially read when an information read command is applied from the control device, and an output unit suitable for outputting the read information to the control device in response to the information read command. The control device applies the information read command to the memory device, and checks a state of the memory device by using the output information, which is transferred from the memory device.

According to the embodiments of the present invention, a repair history and/or a setting history of a semiconductor device and a memory device may be easily managed.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
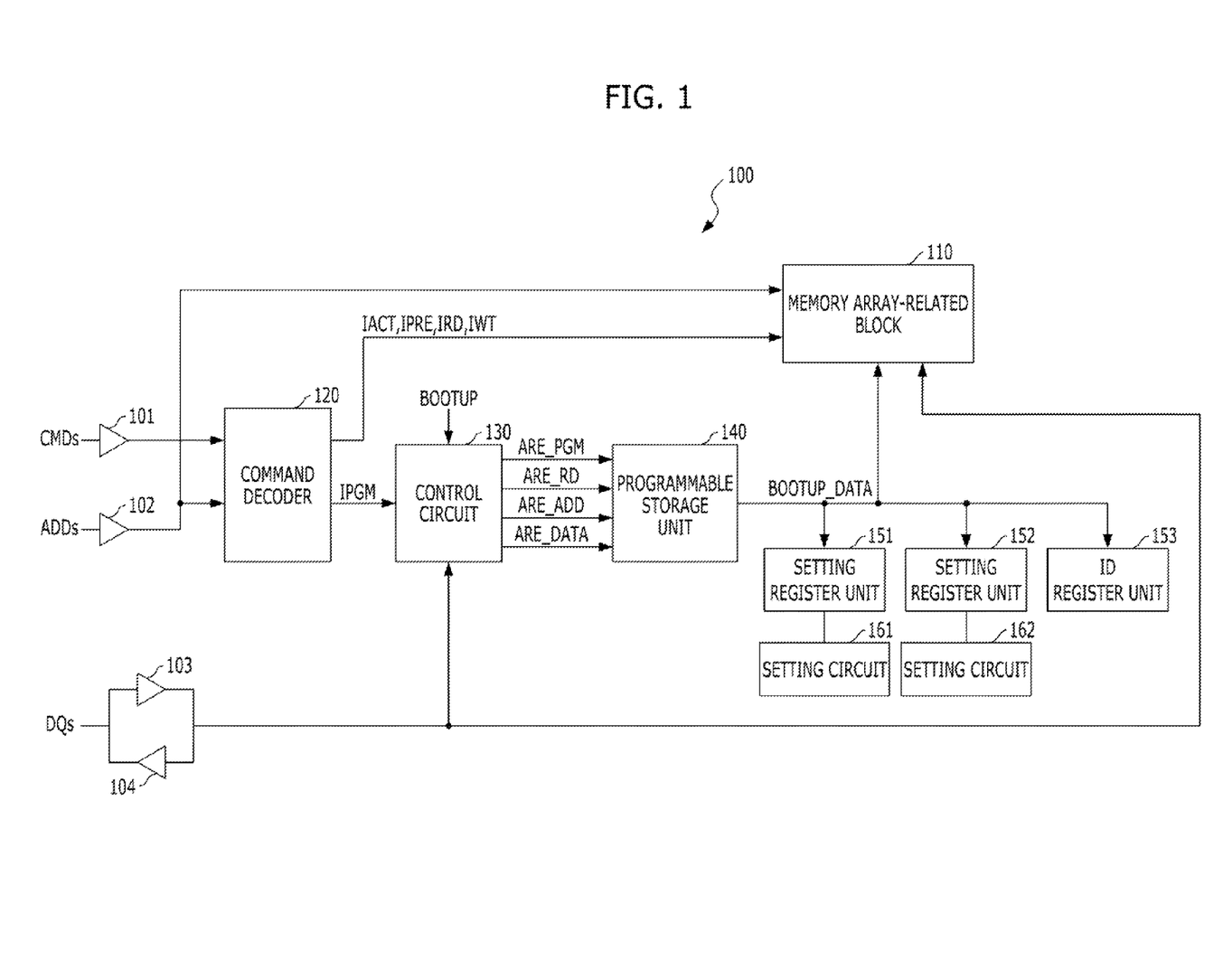
FIG. 1 is a block diagram illustrating a memory device in accordance with an embodiment of the present invention.

FIG. 1 is a block diagram illustrating a memory device 100 in accordance with an embodiment of the present invention.

Referring to FIG. 1, the memory device 100 may include a memory array-related block 110, a command input unit 101, an address input unit 102, a data input unit 103, a data output unit 104, a command decoder 120, a control unit 130, a programmable storage unit 140, setting register units 151 and 152, an ID register unit 153, and setting circuits 161 and 162. Here, the command input unit 101, the address input unit 102, the data input unit 103, and the data output unit 104 are basic elements for the memory array-related block 110. For example, an address for the memory array-related block 110 is inputted through the address input unit 102. However, a signal inputted through the address input unit 102 may not be an address for another configuration. Furthermore, data for the memory array-related block 110 is inputted through the data input unit 103. However, an address for the programmable storage unit 140 may be inputted through the data input unit 103.

The command input unit 101 may receive command signals CMDs that are inputted from the outside of the memory device 100, for example, from a memory controller. The command signals CMDs may include a chip select signal (CS), an active signal (ACT), a row address strobe signal (RAS), a column address strobe signal (CAS), and a write enable signal (WE).

The address input unit 102 may receive multi-bit addresses ADDs that are inputted from the outside. The addresses ADDs may include a bank group address and a bank address in addition to normal addresses corresponding to a row address or a column address. The row address and the column address may be substantially inputted through the same pad, an address inputted in synchronization with the row address strobe signal RAS may be recognized by the memory device 100 as a row address, and an address inputted in synchronization with the column address strobe signal CAS may be recognized by the memory device 100 as a column address.

The data input unit 103 may receive multi-bit data DQs that is inputted from the outside, and the data output unit 104 may output data to the outside of the memory device 400. For example, data to be written in the memory array-related block 110 of the memory device may be inputted through the data input unit 103, and data read from the memory array-related block 110 may be outputted through the data output unit 104.

The command decoder 120 may decode the command signals CMDs inputted through the command input unit 101, and generate internal command signals. When the command decoder 120 generates the internal command signals, some of the address signals ADDs inputted through the address input unit 102 may be used as well as the command signals CMDs inputted through the command input unit 101. The internal command signals may include an internal active signal IACT, an internal precharge signal IPRE, an internal read signal IRD, an internal write signal IWT, and the like. These internal command signals IACT, IPRE, IRD, and IWT may be transferred to the memory array-related block 110.

Furthermore, the command decoder 120 may combine the command signals CMDs inputted through the command input unit 101 with some of the address signals ADDs inputted through the address input unit 102, and may generate internal command signals related to the programmable storage unit 140. The internal command signals related to the programmable storage unit 140 may include an internal program signal IPGM. The internal program signal IPGM may be an internal command signal for programming (or writing) information to the programmable storage unit 140.

The memory array-related block 110 may perform an operation for reading or writing data according to an instruction of the command decoder 120. In the write operation, data inputted from the outside through the data input unit 103 is stored in the memory array-related block 110, and in the read operation, data stored in the memory array-related block 110 is outputted to the outside through the data output unit 104. The configuration of the memory array-related block 110 will be described in detail with reference to FIG. 2.

The programmable storage unit 140 may store information used for the memory device 100. The information may include repair information for repairing failed memory cells in the memory array-related block 110, setting information for an operation of the memory device 100, device ID information of the memory device 100, and the like. The information BOOTUP_DATA stored in the programmable storage unit 140 may be transmitted to and used in the register units 151, 152, and 153, and register units 241 and 242 shown in FIG. 2 in the memory array-related block 110. A process, in which the information BOOTUP_DATA stored in the programmable storage unit 140 is transmitted to the register units 151, 152, 153, 241, and 242, is called a boot-up operation. The reason why the information stored in the programmable storage unit 140 is not directly used and is stored in the register units 151, 152, 153, 241, and 242 and then is used is as follows. Since the programmable storage unit 140 has an array structure, a predetermined time is used for calling data stored therein. However, the information stored in the programmable storage unit 140 is to be immediately used. Accordingly, the boot-up operation, in which the information BOOTUP_DATA stored in the programmable storage unit 140 is transmitted to the register units 151, 152, 153, 241, and 242, is performed, and the information stored in the register units 151, 152, 153, 241, and 242 is used by the memory device 100 after the boot-up operation is performed. The programmable storage unit 140 may be one of nonvolatile memories such as an E-fuse array circuit, a NAND flash memory, a NOR flash memory, a magnetic random access memory (MRAM), a spin transfer torque RAM (STT-MRAM), a resistive RAM (ReRAM), and a phase change RAM (PCRAM), as disclosed in U.S. Pat. No. 6,904,751, U.S. Pat. No. 6,777,757, U.S. Pat. No. 6,667,902, U.S. Pat. No. 7,173,851, and U.S. Pat. No. 7,269,047.

The main function of the memory device 100 is a write operation for writing data inputted from the outside, and a read operation for providing the stored data to the outside. Therefore, the capacity of the memory array-related block 110, in which the read and write operations are performed, is relatively large, but the capacity of the programmable storage unit circuit 140, which stores information used for the memory device 100 itself, may be relatively small. For example, when it is assumed that several gigabits of data is stored in the memory array-related block 110, only several to several tens of megabits of data may be stored in the programmable storage unit 140.

The control unit 130 may control an operation for programming the programmable storage unit 140 and the boot-up operation for transmitting data of the programmable storage unit 140 to the register units 151, 152, 153, 241, and 242.

When the internal program signal IPGM is activated, the control unit 130 activates a program signal ARE_PGM for programming the programmable storage unit 140, and applies an address ARE_ADD and data ARE_DATA to the programmable storage unit 140. The address ARE_ADD and the data ARE_DATA of the programmable storage unit 140 may be inputted through the data input unit 103. Since the programmable storage unit 140 has a relatively small capacity, all the address ARE_ADD and the data ARE_DATA may be applied through the data input unit 103. The control unit 130 may classify some of signals inputted through the data input unit 103 into the address ARE_ADD and the other of the signals into the data ARE_DATA. For example, when a signal of 32-bits is inputted through the data input unit 103, the control unit 130 may classify 16-bits of the-32 bits into the address ARE_ADD and the other 16-bits into the data ARE_DATA, and transfer the address ARE_ADD and the data ARE_DATA to the programmable storage unit 140.

In the boot-up operation in which a boot-up signal BOOTUP is activated, the control unit 130 may control the programmable storage unit 140 so that all the information stored in the programmable storage unit 140 is transmitted to the register units 151, 152, 153, 241, and 242. The control unit 130 may periodically activate a read signal ARE_RD for allowing the programmable storage unit 140 to perform a read operation, and may control all data of the programmable storage unit 140 to be read by changing the address ARE_ADD whenever the read signal ARE_RD is activated. The boot-up operation is generally performed during an initialization period of the memory device, and the address ARE_ADD applied to the programmable storage unit 140 in the boot-up operation may be generated in the control unit 130 through a counting scheme.

The setting register units 151 and 152 may receive and store setting information of the boot-up information BOOTUP_DATA outputted from the programmable storage unit 140 at the time of the boot-up. The information stored in the setting register unit 151 may be used by the setting circuit 161, and the information stored in the setting register unit 152 may be used by the setting circuit 162. The setting circuits 161 and 162 may perform a setting operation used for the operation of the memory device. For example, the setting circuit 161 may set (or tune) levels of various voltages used in the memory device 100, and the setting circuit 162 may set various parameters, for example, latency, of the memory device. The ID register unit 153 may receive and store the device ID information of the boot-up information BOOTUP_DATA outputted from the programmable storage unit 140 at the time of the boot-up. The device ID information may include information regarding a process in which the memory device 140 is fabricated, a date on which the memory device 140 is fabricated in the process, and a sequence of the memory device 140 among memory devices simultaneously fabricated.

Figure 2:
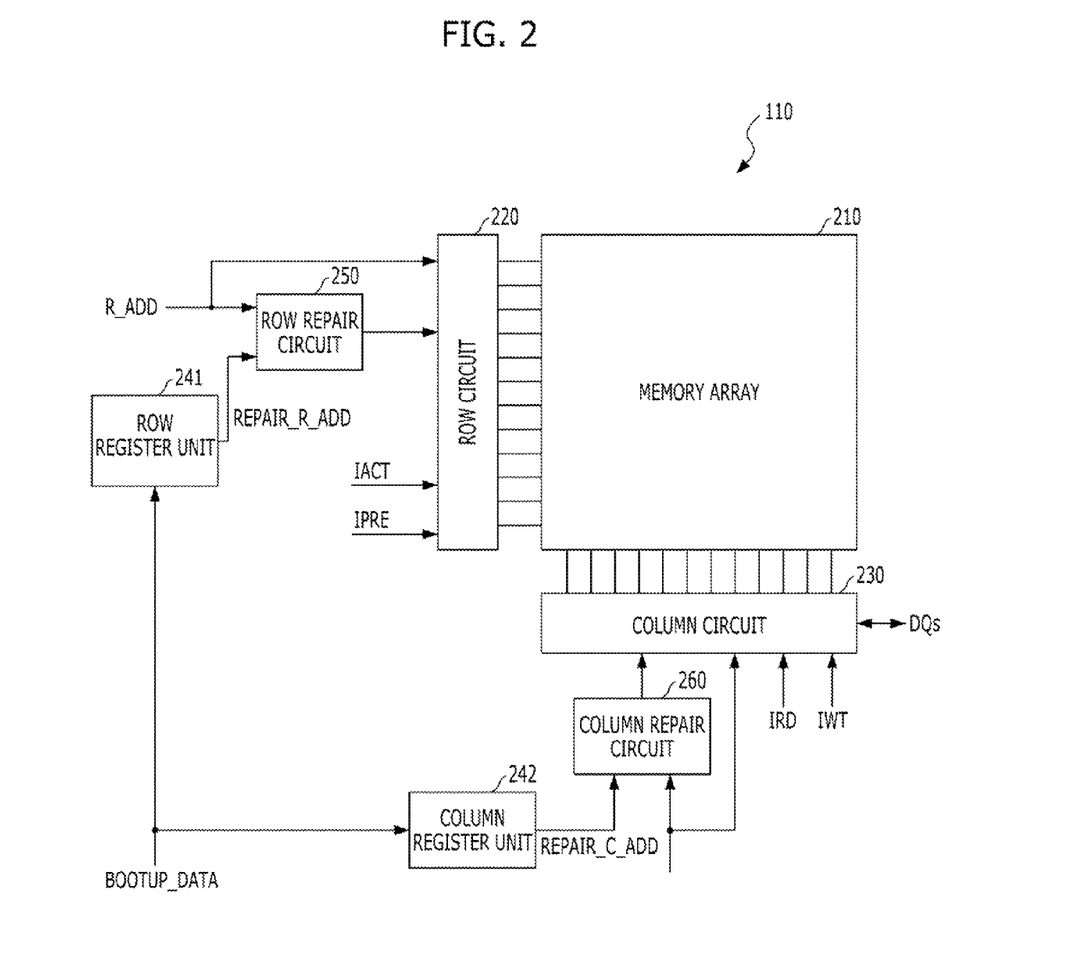
FIG. 2 is a detailed diagram of a memory array-related block shown in FIG. 1.

FIG. 2 is a detailed diagram of the memory array-related block 110 shown in FIG. 1.

Referring to FIG. 2, the memory array-related block 110 may include a memory array 210 including a plurality of memory cells, a row circuit 220, a column circuit 230, a row register unit 241, a column register unit 242, a row repair circuit 250, and a column repair circuit 260.

The row register unit 241 may store information for repairing a row of the information BOOTUP_DATA transferred from the programmable storage unit 140. The information for repairing a row may be a repair row address REPAIR_R_ADD indicating a failed row in the memory array 210.

The row repair circuit 250 may compare the repair row address REPAIR_R_ADD transferred from the row register 241 with a row address R_ADD inputted from the outside through the address input unit 102, and transfer a result of the comparison to the row circuit 220.

The row circuit 220 may activate a word line, which is selected by the row address R_ADD in the memory array 210, at the time of activation of the internal active signal IACT. When the row circuit 220 is determined that the row address R_ADD coincides with the repair row address REPAIR_R_ADD from the row repair circuit 250, the row circuit 220 does not activate a word line corresponding to the row address R_ADD and activates a redundancy word line. That is, a row (or a word line) corresponding to the repair row address REPAIR_R_ADD stored in the row register 241 is replaced with a redundancy row (or a redundancy word line). When the internal precharge command IPRE is activated, the row circuit 220 deactivates the activated word line.

The column register 242 may store information for repairing a column of the boot-up information BOOTUP_DATA transferred from the programmable storage unit 140. The information for repairing a column may be a repair column address REPAIR_C_ADD indicating a failed column in the memory array 210.

The column repair circuit 260 may compare the repair column address REPAIR_C_ADD transferred from the column register 242 with a column address C_ADD inputted from the outside through the address input unit 102, and transfer a result of the comparison to the column circuit 230.

The column circuit 230 accesses data of a bit line selected by the column address C_ADD. When the internal read signal IRD is activated, the column circuit 230 outputs data from the selected bit line, and when the internal write signal IWT is activated, the column circuit 230 transfers data to the selected bit line and allows the data to be written. When the column circuit 230 is determined that the column address C_ADD coincides with the repair column address REPAIR_C_ADD from the column repair circuit 260, the column circuit 230 does not access a bit line corresponding to the column address C_ADD, and accesses a redundancy bit line. That is, a column (or a bit line) corresponding to the repair column address stored in the column register 242 is replaced with a redundancy column (or a redundancy bit line).

Figure 3:
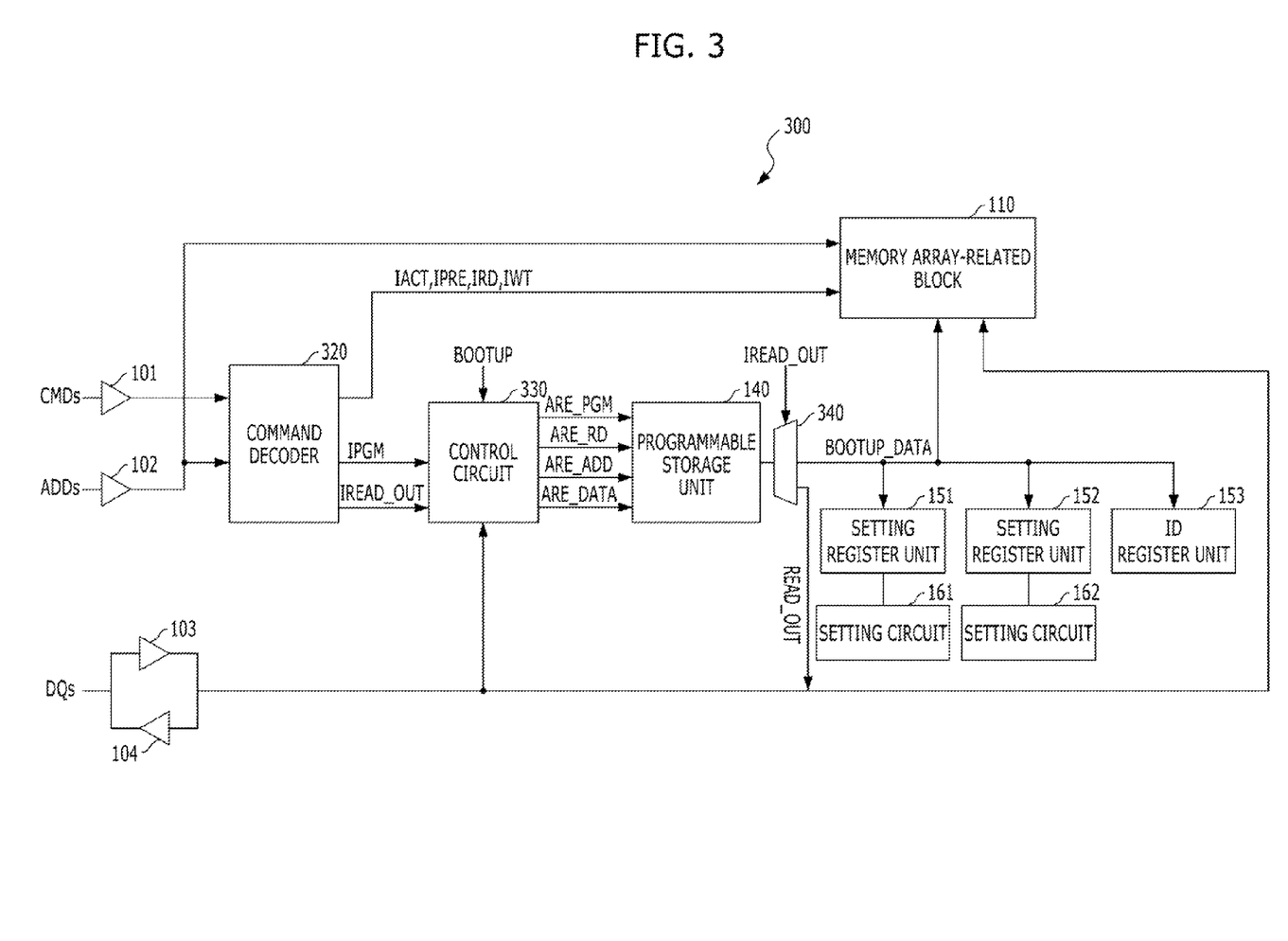
FIG. 3 is a diagram illustrating a memory device in accordance with another embodiment of the present invention.

FIG. 3 is a block diagram of a memory device 300 in accordance with another embodiment of the present invention. The memory device 300 of FIG. 3 further has a function of outputting the information stored in the programmable storage unit 140 to the outside of the memory device 300 as compared with the memory device 100 shown in FIG. 1. In the memory device 300 shown in FIG. 3, the same reference numerals are used to designate the same elements as those of the memory device 100 shown in FIG. 1.

A command decoder 320 may decode the command signals CMDs, and generate both the internal command signals IACT, IPRE, IRD, and IWT for the memory array-related block 110 and the internal command signals IPGM and IREAD_OUT related to the programmable storage unit 140. When the internal command signals IACT, IPRE, IRD, IWT, IPGM, and IREAD_OUT are generated, some of the address signals ADDs may be used as well as the command signals CMDs. The command decoder 320 further generates an information read command signal IREAD_OUT as compared with the command decoder 120 shown in FIG. 1, wherein the information read command signal IREAD_OUT is a signal for instructing an operation for outputting all the information stored in the programmable storage unit 140 to the outside.

A control unit 330 may operate, similarly to the control unit 130 shown in FIG. 1, when the internal program signal IPGM is activated and the boot-up signal BOOTUP is activated. When the information read command signal IREAD_OUT is activated, the control unit 330 may operate similarly to the case in which the boot-up signal BOOTUP is activated. When the information read command signal IREAD_OUT is activated, the control unit 330 may periodically activate the read signal ARE_RD for allowing the programmable storage unit 140 to perform the read operation, and change the address ARE_ADD applied to the programmable storage unit 140 whenever the read signal ARE_RD is activated. That is, when the information read command signal IREAD_OUT is activated, the control unit 330 may control the programmable storage unit 140 such that all the information stored in the programmable storage unit 140 is read.

A path selection unit 340 may transfer the information, which is outputted from the programmable storage unit 140, to one of two paths BOOTUP_DATA and READ_OUT. When the information read command signal IREAD_OUT is activated, the control unit 330 may transfer the boot-up information outputted from the programmable storage unit 140 to the path READ_OUT, and allow the information stored in the programmable storage unit 140 to be outputted to the outside through the data output unit 104. When the information read command signal IREAD_OUT is deactivated, the control unit 330 may transfer the boot-up information outputted from the programmable storage unit 140 to the boot-up path BOOTUP_DATA, and allow the boot-up operation to be performed.

According to the embodiment of FIG. 3, a new command called the information read command is introduced to the memory device, and when the information read command is applied, all the information stored in the programmable storage unit in the memory device is outputted to the outside. Since the programmable storage unit stores repair information and various types of setting information for the operation of the memory device, it is possible to easily check history information of the memory device from the outside. Since it is possible to check the history information of the memory device by simply applying the information read command to the memory device, it is not necessary to manage repair histories and setting histories of many memory devices that are being fabricated or have been fabricated in the conventional art. Furthermore, since a device ID is used for the history management of the memory device, the device ID may not be stored in the programmable storage unit, so that the Id register unit may be omitted.

In the embodiment of FIG. 3, the case, in which the boot-up information of the memory device is outputted to the outside through the data output unit in response to the information read command, has been exemplified. However, this is for illustrative purposes only. It is noted that the boot-up information of the memory device may be outputted to the outside through different types of pads other than the data pad.

Figure 4:
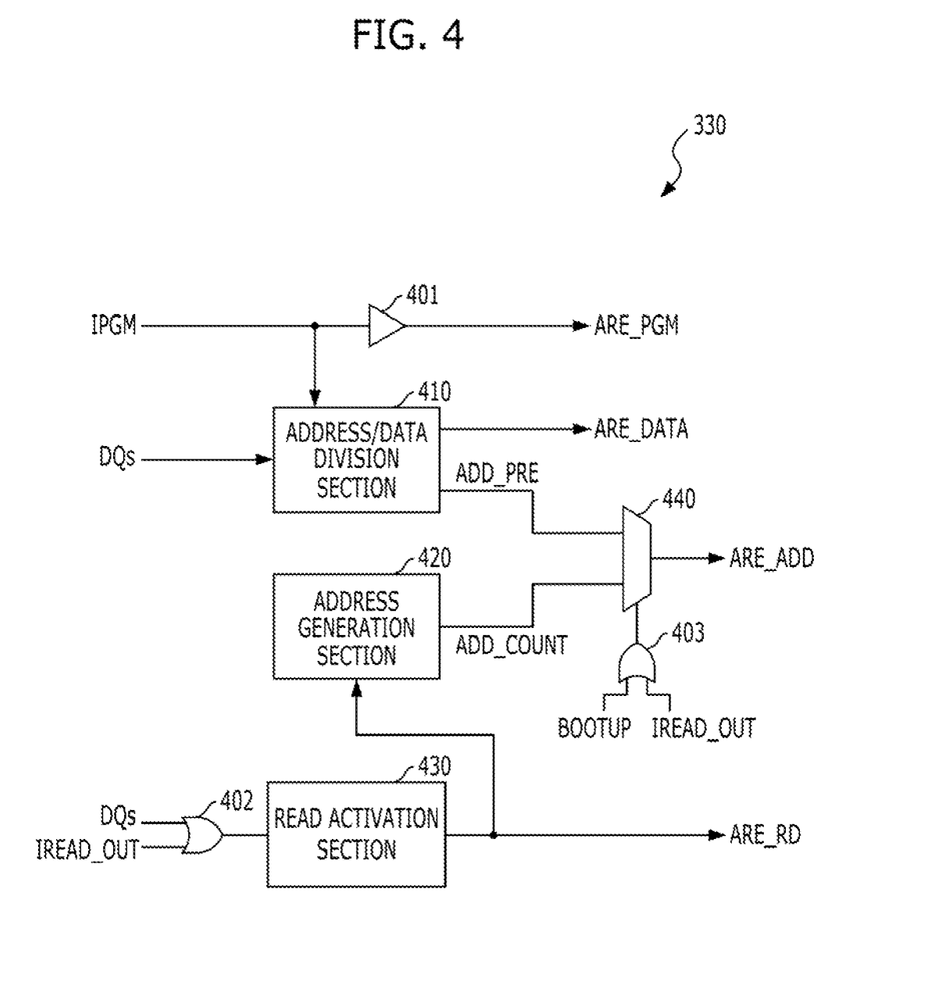
FIG. 4 is a detailed diagram of a control unit shown in FIG. 3.

FIG. 4 is a detailed diagram of the control unit 330 shown in FIG. 3.

Referring to FIG. 4, the control unit 330 may include an address/data division section 410, an address generation section 420, an address selection section 440, and a read activation section 430.

A driver 401 may transfer the internal program signal IPGM to the programmable storage unit 140 as the program signal ARE_PGM. The address/data division section 410 may be activated in response to the internal program signal IPGM, and may divide signals DQs inputted through the data input unit 103 into data ARE_DATA and an address ADD_PRE of the programmable storage unit 140.

The read activation section 430 may be activated when one or more of the boot-up signal BOOTUP and the Information read command signal IREAD_OUT are activated. When the read activation section 430 is activated, it may be possible to periodically activate the read signal ARE_RED to be transferred to the programmable storage unit 140. The address generation section 420 may change (e.g., increase) a value of an address ADD_COUNT whenever the read signal ARE_RED is activated.

When one or more of the boot-up signal BOOTUP and the information read command signal IREAD_OUT are activated, the address selection section 440 may transfer the address ADD_COUNT as the address ARE_ADD of the programmable storage unit 140. Alternatively, the address selection section 440 may transfer the address ADD_PRE as the address ARE_ADD of the programmable storage unit 140. An OR gate 403 receiving the boot-up signal BOOTUP and the information read command signal IREAD_OUT may be used for controlling the address selection section 440.

Figure 5:
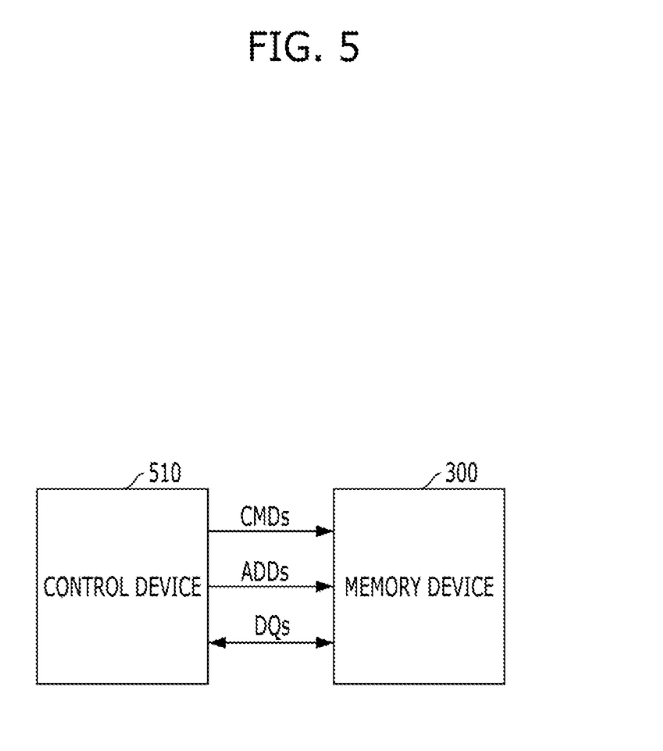
FIG. 5 is a block diagram illustrating a system the memory device shown in FIG. 3.

FIG. 5 is a block diagram illustrating a system including the memory device 300.

Referring to FIG. 5, the system includes a control device 510 and the memory device 300 shown in FIG. 3.

The control device 510 may be a test equipment for testing the memory device 300 or a memory controller for controlling the memory device. The control device 510 may apply the commands CMDs and the addresses ADDs to the memory device 300, exchange data DQs with the memory device 300, and test the memory device 300 or operate the memory device 300.

When the control device 510 requests a repair history or a setting history of the memory device 300, the control device 510 may apply an information read command to the memory device 300 through a combination of the command signals CMDs. In response to the information read command applied from the control device 510, the memory device 300 may transfer all the information stored in the programmable storage unit 140 to the control device 510. The control device 510 may understand various types of information used for a test or an operation of the memory device 300, such as a repair history or a setting history of the memory device 300, by using the information transferred from the memory device 300.

Although various embodiments have been described for illustrative purposes, it will be apparent to those skilled in the art that various changes and modifications may be made without departing from the spirit and scope of the invention as defined in the following claims.

Particularly, the aforementioned embodiment has been described an example in which the present invention is applied to a memory device. However, it is noted that the present invention can also be applied to the case in which a programmable storage unit exists in a general semiconductor device and information to be used in the semiconductor device is stored in the programmable storage unit.

While the present invention has been described with respect to the specific embodiments, it will be apparent to those skilled in the art that various changes and modifications may be made without departing from the spirit and scope of the invention as defined in the following claims.

What is claimed is:

1. A memory device comprising:
   a memory array suitable for storing write data of the memory device and providing the stored data as read data of the memory device;
   a programmable storage unit suitable for storing information for the memory device including repair information for repairing the memory array and setting information for the memory device;

a command decoder suitable for decoding one or more command signals, and generating a write command for writing the write data, a read command for outputting the read data, and an information read command for outputting information stored in the programmable storage unit;
a control unit suitable for controlling the information stored in the programmable storage unit to be sequentially read in response to the information read command; and
an output unit suitable for outputting the read information to an outside of the memory device in response to the information read command,
wherein the control unit controls the information stored in the programmable storage unit to be sequentially read in a boot-up operation, and
the memory device further comprises:
one or more first register units suitable for storing the repair information read from the programmable storage unit in the boot-up operation; and
one or more second register units suitable for storing the setting information read from the programmable storage unit in the boot-up operation.

2. The memory device of claim 1, wherein the information for the memory device further includes a device ID of the memory device.

3. The memory device of claim 1, further comprising:
one or more repair circuits suitable for replacing a failed cell in the memory array with a redundancy cell by using the repair information stored in the one or more first register units; and
one or more setting circuits suitable for performing a setting operation of the memory device by using the setting information stored in the one or more second register units.

4. The memory device of claim 1,
wherein the programmable storage unit includes an E-fuse array circuit.

5. A memory device comprising:
a memory array suitable for storing write data of the memory device and providing the stored data as read data of the memory device;
a programmable storage unit suitable for storing information for the memory device;
a command decoder suitable for decoding one or more command signals, and generating a write command for writing the write data, a read command for outputting the read data, and an information read command for outputting information stored in the programmable storage unit;
a control unit suitable for controlling the information stored in the programmable storage unit to be sequentially read in response to the information read command; and
an output unit suitable for outputting the read information to an outside of the memory device in response to the information read command,
wherein the information for the memory device includes repair information for repairing the memory array and setting information for the memory device,
wherein the control unit comprises:
a read activation section suitable for activating a read command to be applied to the programmable storage unit at a predetermined cycle; and
an address generation section suitable for changing an address to be applied to the programmable storage unit when the read command is activated.

6. A semiconductor device comprising:
a programmable storage unit suitable for storing boot-up information;
one or more register units suitable for receiving and storing the boot-up information in a boot-up operation;
an output unit suitable for outputting the boot-up information to an outside when an information read command is applied; and
a control unit suitable for controlling the boot-up information stored in the programmable storage unit to be sequentially read when the boot-up operation is performed or when the information read command is applied,
wherein the control unit comprises:
a read activation section suitable for activating a read command to be applied to the programmable storage unit at a predetermined cycle; and
an address generation section suitable for changing an address to be applied to the programmable storage unit when the read command is activated.

7. The semiconductor device of claim 6, wherein the boot-up information stored in the one or more register units is used for an operation of the semiconductor device.

8. The semiconductor device of claim 7, wherein the boot-up information includes setting information and repair information.

9. The semiconductor device of claim 6, wherein the programmable storage unit includes an E-fuse array circuit.

10. A system including a control device and a memory device,
wherein the memory device comprises:
a memory array suitable for storing write data applied from the control device together with a write command, and providing the stored data as read data in response to a read command applied from the control device including information for repair of the memory array and setting information of the memory device;
a programmable storage unit suitable for storing information for the memory device;
a control unit suitable for controlling the information stored in the programmable storage unit to be sequentially read when an information read command is applied from the control device; and
an output unit suitable for outputting the read information to the control device in response to the information read command, and
wherein the control device applies the information read command to the memory device, and checks a state of the memory device by using the output information, which is transferred from the memory device,
wherein the control unit controls the information stored in the programmable storage unit to be sequentially read in a boot-up operation, and
the memory device further comprises:
one or more first register units suitable for storing repair information read from the programmable storage unit in the boot-up operation; and
one or more second register units suitable for storing setting information read from the programmable storage unit in the boot-up operation.

11. The system of claim 10, wherein the memory device further comprises:
one or more repair circuits suitable for replacing a failed cell in the memory array with a redundancy cell by using the repair information stored in the one or more first register units; and one or more setting circuits suitable for performing a setting operation of the memory device by using the setting information stored in the one or more second register units.

12. The system of claim 10, wherein the control device includes a test equipment.

13. The system of claim 10, wherein the control device includes a memory controller.

14. The system of claim 10, wherein the programmable storage unit includes an E-fuse array circuit.

* * * * *